(12) United States Patent
Hartmann et al.

(10) Patent No.: US 10,193,024 B2
(45) Date of Patent: Jan. 29, 2019

(54) OPTOELECTRONIC SEMICONDUCTOR CHIP AND METHOD OF PRODUCING AN OPTOELECTRONIC SEMICONDUCTOR CHIP

(71) Applicant: OSRAM Opto Semiconductors GmbH, Regensburg (DE)

(72) Inventors: Rainer Hartmann, Regensburg (DE); Martin Mandl, Lappersdorf (DE); Simeon Katz, Regensburg (DE); Andreas Rückerl, Konzell (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 15/758,382

(22) PCT Filed: Sep. 26, 2016

(86) PCT No.: PCT/EP2016/072854
§ 371 (c)(1),
(2) Date: Mar. 8, 2018

(87) PCT Pub. No.: WO2017/055215
PCT Pub. Date: Apr. 6, 2017

(65) Prior Publication Data
US 2018/0254384 A1   Sep. 6, 2018

(30) Foreign Application Priority Data

Sep. 29, 2015   (DE) .................... 10 2015 116 495

(51) Int. Cl.
*H01L 33/44* (2010.01)
*H01L 33/38* (2010.01)
(Continued)

(52) U.S. Cl.
CPC ............ *H01L 33/382* (2013.01); *H01L 31/00* (2013.01); *H01L 33/0062* (2013.01);
(Continued)

(58) Field of Classification Search
None
See application file for complete search history.

(56) References Cited

U.S. PATENT DOCUMENTS 7,622,746 B1 * 11/2009 Lester ..................... H01L 33/46
257/98
2010/0140636 A1   6/2010 Donofrio et al.
(Continued)

FOREIGN PATENT DOCUMENTS

DE   10 2007 022 947 A1   10/2008
DE   10 2010 013 494 A1   10/2011
(Continued)

*Primary Examiner* — Asok K Sarkar
*Assistant Examiner* — Grant Withers
(74) *Attorney, Agent, or Firm* — DLA Piper LLP (US)

(57) ABSTRACT

An optoelectronic semiconductor chip includes an active region arranged between a first semiconductor layer and a second semiconductor layer and generates or receives electromagnetic radiation, the first semiconductor layer electrically conductively connects to a first contact, the first contact is formed on a front side of the chip next to the active region, the second semiconductor layer electrically conductively connects to a second contact, the second contact is arranged on the front side of the chip next to the active region, and an electrically insulating separating layer that electrically insulates a rear side of the chip from the active region of the semiconductor chip, and an electrically insulating separating layer includes at least one first separating layer having at least one atomic layer or at least one molecular layer and is deposited by atomic layer deposition or molecular layer deposition.

17 Claims, 3 Drawing Sheets

(51) Int. Cl.
 *H01L 31/00* (2006.01)
 *H01L 33/00* (2010.01)
(52) U.S. Cl.
 CPC ........ *H01L 33/0079* (2013.01); *H01L 33/387* (2013.01); *H01L 33/44* (2013.01); *H01L 2933/0025* (2013.01)

(56) References Cited

U.S. PATENT DOCUMENTS

| | | | |
|---|---|---|---|
| 2013/0140598 A1* | 6/2013 | Hoppel | H01L 33/40 257/98 |
| 2013/0285067 A1* | 10/2013 | Bethoux | H01L 21/76254 257/76 |
| 2016/0225749 A1* | 8/2016 | Leirer | H01L 25/167 |
| 2018/0130925 A1* | 5/2018 | Weiss | H01L 33/14 |

FOREIGN PATENT DOCUMENTS

| | | |
|---|---|---|
| DE | 10 2010 048 159 A1 | 4/2012 |
| DE | 10 2011 115 659 A1 | 3/2013 |
| WO | 2014/090605 A1 | 6/2014 |

\* cited by examiner

OPTOELECTRONIC SEMICONDUCTOR CHIP AND METHOD OF PRODUCING AN OPTOELECTRONIC SEMICONDUCTOR CHIP

TECHNICAL FIELD

This disclosure relates to an optoelectronic semiconductor chip and a method of producing an optoelectronic semiconductor chip.

BACKGROUND

Figure 3:
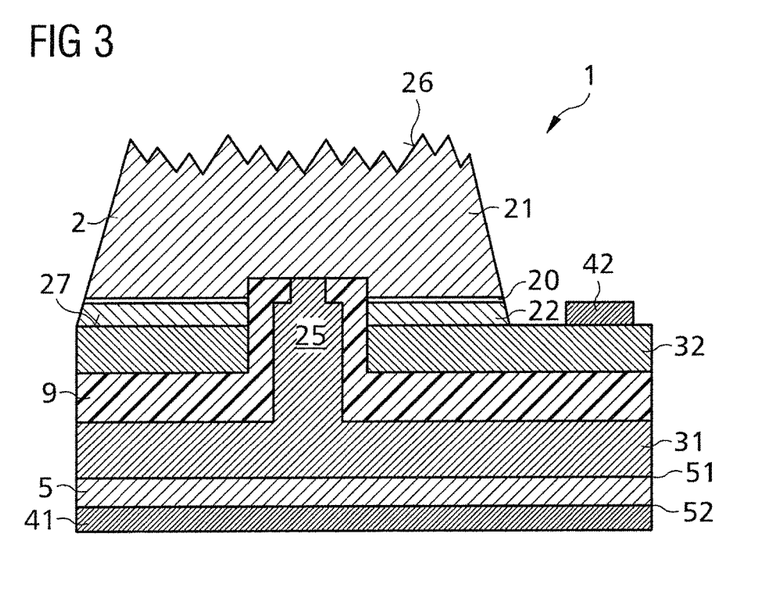
FIG. 3 shows an example of a known optoelectronic semiconductor chip in a schematic sectional view.

Characteristically, thin-film light-emitting diode chips consist of a semiconductor body for generating and/or receiving radiation, a carrier (for example, Si, Ge) that does not correspond to the growth substrate for the epitaxial production of the light-emitting layer sequence, and a first and a second electrical connection layer that are electrically insulated from one another by a separating layer. FIG. 3 shows a schematic sectional view of a known thin-film light-emitting diode chip in the form of a surface emitter. The light-emitting diode chip (1) has a semiconductor body (2) comprising a semiconductor layer sequence. The semiconductor layer sequence has, in particular, an active region (20) designed to generate and/or receive radiation. Typically, the active region (20) is arranged between a first semiconductor layer (21) and a second semiconductor layer (22) of different conduction type. For example, the first semiconductor layer (21) facing the front side is n-conducting and the second semiconductor layer (22) facing away from the front side is p-conducting.

The semiconductor body (2) is arranged on the front side (51) of an electrically conductive carrier (5). Between the semiconductor body (2) and the carrier (5), typically, a first (31) and a second (32) electrical connection layer are arranged and for electrical insulation an insulating separating layer (9). The first semiconductor layer (21) is contacted via recesses (25) in the semiconductor body (2) and via the first connection layer (31) to a first contact (41) located on the rear side of the carrier (5). The second semiconductor layer (22) connects to a second contact (42) via the second connection layer (32) on the front side of the semiconductor chip. The proposed light-emitting diode chip (1) has both a front contact (42) and a rear contact (41).

For various applications, a thin-film light-emitting diode chip is advantageous, wherein the contacts are located exclusively on the front side. Such a light-emitting diode chip, which is called in the following rear side insulation chip, an electrical separation of the rear side of the chip and the front side of the chip is necessary. There is no electrical connection between the rear side of the chip and the electrical connection layers (31, 32). An electrical separation of the front side and the rear side of a thin-film light-emitting diode chips may be produced, for example, by using a ceramic carrier (for example, made of AlN, SiN), a glass carrier or a high-resistance, for example, undoped or lower-doped silicon carrier or germanium carrier. In practice, such solutions are often expensive and can only be integrated with difficulty into the existing production process of standard thin-film light-emitting diode chips.

It could therefore be helpful to provide an optoelectronic semiconductor chip and a method of producing an optoelectronic semiconductor chip that permit improved rear-side insulation.

SUMMARY

We provide an optoelectronic semiconductor chip including a carrier and a semiconductor body having a semiconductor layer sequence arranged on the carrier, and a front side of the chip and a rear side of the chip, wherein the semiconductor layer sequence includes an active region arranged between a first semiconductor layer and a second semiconductor layer and generates or receives electromagnetic radiation, the first semiconductor layer electrically conductively connects to a first contact, the first contact is formed on the front side of the chip next to the active region, the second semiconductor layer electrically conductively connects to a second contact, the second contact is arranged on the front side of the chip next to the active region, and an electrically insulating separating layer that electrically insulates the rear side of the chip from the active region of the semiconductor chip, and the electrically insulating separating layer includes at least one first separating layer having at least one atomic layer or at least one molecular layer and is deposited by atomic layer deposition or molecular layer deposition.

We also provide a method of producing an optoelectronic semiconductor chip having a front side of the chip and an underside of the chip, including providing a semiconductor layer sequence having an active region arranged between a first semiconductor layer and a second semiconductor layer; forming a first contact on the front side of the chip next to the active region, and forming an electrically conductive connection between the first semiconductor layer and the first contact, forming a second contact on the front side of the chip next to the active region, and forming an electrically conductive connection between the second semiconductor layer and the second contact, forming an electrically insulating separating layer by atomic layer coating or molecular layer coating that electrically insulates the rear side of the chip from the active region of the semiconductor chip, and forming a composite of semiconductor layer sequence and carrier.

REFERENCE LIST 1 optoelectronic semiconductor chip
2 semiconductor body
5 carrier
6 separating layer
9 insulation layer
20 active region
21 semiconductor layer
22 semiconductor layer
25 recess
26 radiation passage surface
27 main surface
31 first connecting layer
32 second connection layer
41 contact
42 contact
51 front side of the carrier
52 rear side of the carrier
61 first separating layer
62 second separating layer
63 third separating layer G1 measurement curve
G2 measurement curve
G3 measurement curve
G4 measurement curve
G5 measurement curve
M1 first measurement cycle
M2 second measurement cycle
M3 third measurement cycle
N[%] failure rate
U[V] voltage

DETAILED DESCRIPTION

Our optoelectronic semiconductor chip has a carrier on which a semiconductor layer sequence is arranged. Furthermore, the semiconductor chip has a front side of the chip and a chip rear side of the chip.

The semiconductor layer sequence is preferably grown epitaxially. The semiconductor chip is preferably a thin-film semiconductor chip. The thin-film semiconductor chip is preferably free of a growth substrate or the growth substrate is thinned such that it is no longer mechanically stabilizing for the semiconductor layer sequence. For mechanical stabilization, the thin-film semiconductor chip usually comprises the carrier. The carrier is preferably designed to be electrically conductive.

The semiconductor layer sequence can be attached to the carrier without joining means by bonding. Furthermore, it is also possible for the semiconductor layer sequence to be attached to the carrier with a joining layer, for example, a solder layer or an adhesive layer.

The semiconductor layer sequence comprises an active region arranged between a first semiconductor layer and a second semiconductor layer. The active region of the semiconductor layer sequence generates or receives electromagnetic radiation. The active region is formed, for example, to receive or generate radiation in the ultraviolet, visible or infrared spectrum. Furthermore, the active region is arranged, for example, between the first semiconductor layer and the second semiconductor layer. Appropriately, the first semiconductor layer and the second semiconductor layer are composed of a semiconductor material having a different conduction type. For example, the first semiconductor layer is n-conducting and the second semi-conductor layer is p-conducting or vice versa. Typically, the first semiconductor layer and the second semiconductor layer are electrically conductive and belong to the electrically conductive regions of the semiconductor chip. The semiconductor layer sequence may form a semiconductor body or be part of a semiconductor body. The semiconductor body does not necessarily have to consist of a semiconductor material. Instead, the semiconductor body can also have metallic or oxidic layers in addition to a semiconductor layer sequence.

The first semiconductor layer electrically conductively connects to a first contact. The first contact is arranged on the front side of the chip, in particular next to the active region. The second semiconductor layer electrically conductively connects to a second contact. In this case, the second contact is likewise formed on the front side of the chip, in particular next to the active region. For example, the first and second contact are arranged on or in the vicinity of two opposite outer sides of the semiconductor chip and laterally of the semiconductor body on the front side of the chip.

Furthermore, an additional electrically insulating separating layer is provided. The additional electrically insulating separating layer is located, for example, between the electrical connection layer that is closer to the carrier, that is to say approximately the first connection layer, and the carrier and covers both completely. Alternatively, the insulating separating layer may be arranged over the whole area on the rear side of the carrier. For example, the insulating separating layer comprises one or more atomic or molecular monolayers.

A carrier of a three-layer system is also possible, in which the insulating separating layer is enclosed in the manner of an interlayer on both sides of the carrier material (for example, Si or Ge). In a thin-film light-emitting diode chip without an external carrier, the separating layer is preferably arranged on the rear side of the chip on the connection layer that is closer to the rear side.

Preferably, a first and a second electrical connection layer are arranged between the carrier and the semiconductor body. The first and the second connection layers are electrically insulated from one another by an insulation layer.

The insulating separating layer may be arranged on a front side of the carrier, on a rear side of the carrier or within the carrier. For example, the insulating separating layer is arranged between the one connecting layer closest to the carrier and the carrier.

The electrically insulating separating layer may have at least one first separating layer. The first separating layer has at least one atom layer or at least one molecular layer. For example, the first separating layer is formed as a closed layer without recesses or pores. Such a layer can be achieved, for example, by atomic layer deposition or molecular layer deposition by two or more cyclically performed self-limiting surface reactions on a surface of the semiconductor body or of the carrier.

The atomic layer and/or the molecular layer may have one or more layers. In atomic layer deposition or a molecular layer deposition, the separating layer may grow by a determinable value per method cycle by a self-limiting reaction. The separating layer thus increases proportionally to the number of reaction cycles, thereby enabling an exact control of the layer thickness.

The first separating layer may have at least one or more insulating oxide or nitride compounds, for example, $Al_xO_y$, $SiO_2$, $Ta_xO_y$, TaN, TiO, SiN, AlN, TiN, $ZrO_2$, $HfO_2$, $HfSiO_4$, $ZrSiO_4$, HfSiON.

The electrically insulating separating layer may have a layer sequence made of electrically insulating materials. In particular, the electrically insulating materials can be different.

The layer sequence may comprise the first separating layer and at least one second separating layer. The second separating layer has on or a plurality of deposition layers. For example, the second separating layer can be applied with alternative methods having high deposition rates such as the gas phase deposition or the sputtering method. The first and second separating layer may be matched to one another and achieve an improved electrical insulation. The first separating layer is preferably applied directly in chronological succession onto the second separating layer.

The layer sequence may have a third separating layer. The third separating layer preferably has one or more layer structures that have been deposited by gas phase deposition or sputtering. Deposition of the first separating layer follows the deposition of the second and/or third separating layer.

The first separating layer may at least be partially enclosed by the second and third separating layers. The first separating layer is thus an interlayer at least partially enclosed on its surfaces by the second and third separating layer.

The second and/or the third separating layer may have at least one or more, insulating oxide or nitride compounds, for example, $Al_xO_y$, $SiO_2$, $Ta_xO_y$, TaN, TiO, SiN, AlN, TiN, $ZrO_2$, $HfO_2$, $HfSiO_4$, $ZrSiO_4$ and HfSiON.

The carrier may have an electrically conductive material or semiconducting material. Thus, silicon or germanium are suitable as material for the carrier. Furthermore, the carrier may have a molding material, a ceramic material and/or a high-resistance material. For example, the choice of the carrier material has effects on its coefficient of thermal expansion and may be adapted according to the field of application. A ceramic material or high-resistance material may be provided, for example, for an additional electrical insulation.

The first semi-conductor layer may be arranged on the side of the active region facing away from the carrier. The first semiconductor layer electrically conductively connects to the first contact via a first connection layer.

The semiconductor body may have at least one recess extending through the second semiconductor layer and the active region into the first semiconductor layer. In this case, the first connection layer is arranged at least partially in the recess and electrically conductively connects to the first semiconductor layer.

The second semiconductor layer electrically conductively connects to the second contact via a second connection layer. In this case, the second connection layer is arranged on the side of the active region facing the carrier.

The electrically insulating separating layer of the semiconductor chip may be formed over the entire surface on a main surface of the carrier, particularly preferably in direct contact with the carrier. Furthermore, the electrically insulating separating layer may consist of a first separating layer formed by atomic layer deposition or molecular layer deposition, and a second separating layer and a third separating layer formed by gas phase deposition, wherein the first separating layer is arranged between the second separating layer and the third separating layer and wherein the first separating layer is in direct contact with the second separating layer and the third separating layer, preferably in each case over the entire surface. In other words, the first separating layer, the second separating layer and the third separating layer are each preferably applied directly to one another, wherein the first separating layer is arranged between the second and the third separating layer.

Such an insulating separating layer has the advantage of having a very good breakdown strength while at the same time having a low processing duration.

Typically, the following elements of the semiconductor chip belong to the electrically conductive regions of the semi-conductor chip: the active, radiation-generating region, the connection layers, the electrical contacts and the semiconductor layers. The electrically insulating separating layer preferably insulates the rear side of the chip and/or the carrier from the electrically conductive regions. Particularly preferably, the electrically insulating separating layer insulates the rear side of the chip and/or the carrier from the active region. The rear side of the chip may be formed, for example, by a main surface of the carrier. The carrier and/or the rear side of the chip can be formed to be electrically conductive.

A method of producing an optoelectronic semiconductor chip having a front side of the chip and a rear side of the chip comprises the following steps:

First, a semiconductor layer sequence has an active region arranged between a first semiconductor layer and a second semiconductor layer. A first contact is formed on the front side of the chip, in particular next to the active region. Furthermore, an electrically conductive connection is established between the first semiconductor layer and the first contact. In addition, a second contact is formed on the front side of the chip, in particular next to the active region. In addition, an electrically conductive connection is established between the second semiconductor layer and the second contact.

An electrically insulating separating layer is applied to a rear side of the semiconductor body facing away from the carrier, on the front side of the carrier or in the carrier. Finally, a composite of semiconductor layer sequence and carrier is formed and joined together to form the semiconductor chip.

The method of producing an optoelectronic semiconductor chip comprises the following steps:
1. a semiconductor layer sequence is provided on a growth substrate having the active region arranged between the first semiconductor layer and the second semiconductor layer;
2. a second electrical connection layer is applied to the second semiconductor layer;
3. a breakthrough is formed in the active region;
4. the separating layer is then applied to the rear side of the semiconductor layer sequence;
5. a first electrical connection layer is applied to the rear side of the semiconductor layer sequence, wherein a partial region of the first electrical connecting layer is formed in the breakthrough;
6. the electrically insulating separating layer is applied over the entire surface of the first connection layer;
7. a composite of semiconductor layer sequence, carrier and connection layers is formed and joined to form the semi-conductor chip;
8. the growth substrate is thinned or completely removed; and
9. the semiconductor layer sequence is removed in places, and the first and second contact are applied.

As an alternative to step 6), the insulating separating layer is applied over the entire surface on a front side or a rear side of the carrier. The latter is also possible after the composite formation. Alternatively, the carrier contains the separating layer which is partially enclosed on both sides.

The electrically insulating separating layer may be applied to the side of the semiconductor body facing the carrier or to the carrier by an atomic layer deposition or a molecular layer deposition.

The electrically insulating separating layer may be formed as a combination of a first separating layer on the basis of an atomic layer deposition or molecular layer deposition with at least one further separating layer on the basis of a gas phase deposition or on the basis of a sputtering method. The layer based on the atomic layer deposition/molecular layer deposition directly adjoins at least one gas-phase deposition layer such as a CVD-based (chemical vapor deposition) or a sputtered layer, wherein the first is deposited chronologically succeeding to the second layer.

Atomic layer deposition (ALD) or molecular layer deposition (molecular layer deposition) are possible methods of producing the electrically insulating separating layer as an atomic layer or molecular layer. The methods lead to deposition of thin layers or films by two or more cyclically carried out self-limiting surface reactions. Typically, the layers generally have a polycrystalline or amorphous structure. Within the framework of the proposed principle, however, it is not intended, that the atomic layer deposition or molecular deposition are seen as a conventional gas vapor deposition or CVD method (chemical vapor deposition).

In a CVD method (chemical vapor deposition), the surface to be coated is likewise made available in a volume. Furthermore, at least one starting material is made available in the volume, from which a solid CVD layer is deposited on the surface to be coated by a chemical reaction. Typically, at least one second starting material is found in the volume with which the first starting material reacts chemically to form the solid CVD layer on the surface.

In contrast to CVD processes, in an atomic layer deposition or a molecular layer deposition, the starting materials are reacted cyclically and in succession. The partial reactions may be separated from one another and limited to the surface. The partial reactions are self-limiting, i.e., a starting material of a partial reaction does not react with itself or ligands of itself, which limits the layer growth of a partial reaction per cycle to a maximum of one monolayer.

The electrically insulating separating layer may be applied by at least one of the atomic layer coating and/or molecular layer coating methods known under the following designations:
  atomic layer deposition,
  atomic layer epitaxy,
  atomic layer evaporation,
  atomic layer growth,
  molecular layer deposition, and
  molecular layer epitaxy.

In an ALD method (atomic layer deposition), the surface to be coated is made available in a volume. The volume is supplied with at least one first gaseous starting material which is adsorbed on the surface to be coated. After a preferably complete or almost complete coverage of the surface to be coated with the first starting material, the part of the first starting material, which is still gaseous or is adsorbed on the surface, is generally removed from the volume again and a second starting material is supplied to the volume. The second starting material is provided to interact with the first starting material which is adsorbed on the surface to form a solid ALD layer. Furthermore, the solid ALD layer is typically at least partially covalently coupled to the surface to be coated.

The ALD method is thus distinguished by at least one chemical reaction on the surface to be coated to form the ALD layer. Typically, the chemical reaction takes place at a specific reaction temperature. Particularly preferably, the surface to be coated has the reaction temperature in which chemical reaction takes place to form the solid ALD layer. In the ALD method, more than two starting materials can also be used.

Compared to other deposition methods from the gas phase such as a CVD method (chemical vapor deposition), in particular an ALD method is characterized in that, the respective starting materials for the chemical reaction are introduced into the volume separately from one another to form the layer to be deposited, and non-adsorbed or chemically reacted fractions of the starting materials are removed from the volume, before the volume is supplied with a further starting material. The ALD method has the advantage of enabling a particularly good control of the layer thickness of the layer to be deposited. Furthermore, using an ALD method, a structured surface having a high aspect ratio can be shaped very well.

The ALD layer deposited using an ALD method is distinguished in particular by a very homogeneous layer thickness and a very homogeneous layer structure. In particular, the ALD layer has few defects such as pinholes and a high density.

Particularly preferably, an ALD method is used to deposit the electrically insulating separating layer.

The electrically insulating separating layer may be formed over the entire surface on a main surface of the carrier, preferably in direct contact with the carrier. Furthermore, the electrically insulating separating layer is formed from a first separating layer, a second separating layer and a third separating layer, wherein the first separating layer is arranged between the second separating layer and the third separating layer and the first separating layer is in direct contact with the second separating layer and the third separating layer. The first separating layer is preferably formed with atomic layer deposition or molecular layer deposition and particularly preferably formed by an ALD method, and the second and third separating layers by gas phase deposition.

In the optoelectronic semiconductor chip, the electrical separation of the front side and the rear side is achieved by introducing an additional electrically non-conducting layer into the chip. The electrically insulating separating layer makes it possible to achieve a simple electrical insulation of the front and rear side of a thin-film light-emitting diode chip. Special, electrically insulating carrier materials can be dispensed with, which makes the proposed design and method particularly cost-effective. Furthermore, the proposed method can be integrated into known standard processes of producing optoelectronic semiconductor chips. In particular, in contrast to the use of other carrier materials such as, for example, ceramic-based sub-strains, only marginal to no effects on the processing method of the semiconductor components.

In particular, the proposed method is compatible with existing separation processes, by which a plurality of optoelectronic semiconductor chips are singulated from a wafer. This is not possible in ceramic carriers due to the occurrence of "chipping." The latter must be separated in a complex manner in a so-called "scribe & break" method. An improved compatibility also exists with regard to existing bonding technologies with respect to ceramic carriers. In ceramic carriers, on the contrary, due to CTE mismatches (coefficient of thermal expansion) high fracture rates occur in carrier and/or sapphire. Finally, the method is also compatible with the existing rear-side metallization. Adhesion issues are not to be expected in contrast to ceramic carriers. Compared to a ceramic-based rear side insulation, a further advantage of the method is the good thermal connection of the produced chip to its housing since the majority of the LED chip may consist of materials with high thermal conductivity such as, for example, GaN and silicon.

The method is not only suitable for different light-emitting diode chips. The method can also be advantageously used for a thin-film chip in which the contact layer for the first semiconductor layer is located on the semiconductor body on the chip front side. Also, thin-film semiconductor chips are possible which do not have recesses and such thin-film semiconductor chips in which the connection for the first semiconductor layer sequence is arranged on the semiconductor body. Furthermore, carrier-free thin-film semiconductor chips are possible as a variant. For example, the carrier has a molding material thereof.

Separating layers based on a gas phase deposition, for example, of $SiO_2$ and/or $SiN_x$, are produced at relatively low temperatures on account of the temperature sensitivity of the optoelectronic semiconductor chip. This leads, inter alia, to formation of pores and pinholes in the dielectric that manifest themselves in a significant reduction in the breakdown voltage. In addition, in a CVD method, cracks are formed in the layers at steps (in the topography) of the component. The requirements for the rear-side insulation of the optoelectronic semiconductor chip cannot thus be achieved regularly.

By the first separating layer alone or in a layer sequence with at least one second separating layer on the basis of the gas phase deposition or a sputtering method, pores or pinholes of an already deposited layer may be closed and the electrical insulation may be further improved. An atomic layer or molecular layer represents a typically closed layer with very good overshaping properties. Thus, the first separating layer (e.g., ALD) may counteract the negative effects of pinholes and cracks on the breakdown strength. Pinholes on a surface of the gas phase layers are filled, which also applies to the cracks in the layers occurring at steps.

The breakdown strength of an ideal dielectric layer follows the relationship:

$$U_{br} = E_{crit} \cdot d,$$

wherein $U_{br}$ is the breakdown voltage, $E_{crit}$ is the field strength critical for the layer failure and d is the layer thickness. A high breakdown voltage may thus be achieved by a high value of $E_{crit}$ or large layer thickness d. The layer thickness d can be set essentially freely from expense issues and bracing issues. In contrast, $E_{crit}$ is a layer parameter which is determined by the material and the deposition method. Layers of a predetermined material based on atomic layer deposition or molecular layer deposition naturally have a higher value of $E_{crit}$ than layers of the same material based on CVD or sputtering. However, ALD layers are produced on account of the low deposition rates of the respective coating production methods are typically realized only with low layer thicknesses (approximately 200 nm). By contrast, by virtue of their high deposition rates, gas phase deposition or sputtering method allows relatively large layer thicknesses of a few 100 nm within a sufficiently short time period. Thus, due to the pores and cracks (in particular in low coating temperatures) the layer quality is poor leading to relatively small values of $E_{crit}$. These pores and cracks may be closed with the aid of a subsequent atomic layer deposition or molecular layer deposition, which leads to an increase in $E_{crit}$ and thus of $U_{br}$. The total thickness d of the layer sequence changes only insignificantly due to the relatively low growth rates of the atomic layer deposition/molecular layer deposition. Using a suitable combination of layers based on gas-phase deposition or sputtering processes and atomic layer deposition/molecular layer deposition, both the layer thickness d and the critical field strength $E_{crit}$ can be optimized with regard to a high breakdown voltage.

Overall, with the aid of the first separating layer, electrical breakdowns at low applied voltages may be eliminated or reduced, which are typically subjected to the presence of pinholes. The breakdown strength thus approaches the intrinsic value of a pinhole-free CVD bulk layer. In summary, the introduction of the first separating layer thus allows reliable insulation of the front and rear sides by an additional dielectric in the layer structure of the optoelectronic semiconductor chip.

Further advantages and advantageous refinements and developments result from the following examples illustrated in conjunction with figures.

Elements that are identical, of identical type or act identically are provided with the same reference signs in the figures. The figures and the size relationships of the elements illustrated in the figures among one another should not be regarded as to scale. Rather, individual elements may be illustrated with exaggerated size to enable better illustration and/or to afford a better understanding.

The description given hereinafter is described by way of example on the basis of a semiconductor chip provided to generate radiation, for example, a light-emitting diode semiconductor chip, for example, a LED. The semiconductor chip can also be formed as a radiation receiver in which an active region is provided to generate an electric signal as a function of the incident radiation power on the active region.

Figure 1:
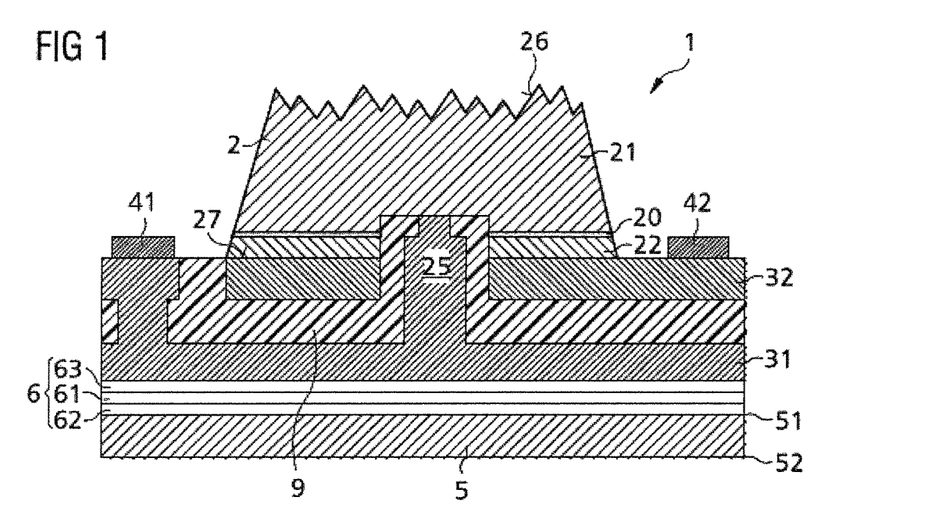
FIG. 1 shows an example of an optoelectronic semiconductor chip in a schematic sectional view.

FIG. 1 shows an example of an optoelectronic semiconductor chip in a schematic sectional view.

The optoelectronic semiconductor chip 1 comprises a semi-conductor body 2. The semiconductor body 2 has a semi-conductor layer sequence with an active region 20. The active region generates radiation in the ultraviolet, visible or infrared spectral range. In the vertical direction, that is to say perpendicular to a main plane of extension of the semiconductor layer sequence of the semiconductor body, the semiconductor body 2 extends between a radiation passage surface 26 and a main surface 27. The active region 20 is arranged between a first semiconductor layer 21 of a first conductivity type and a second semiconductor layer 22 of a second conductivity type different from the first conductivity type. For example, the first semiconductor layer is n-conducting and the second semiconductor layer is p-conducting or vice versa. The semiconductor body, in particular the active region, preferably contains a III-V-compound or a II-VI-compound semiconductor material.

The optoelectronic semiconductor chip 1 is formed, for example, as a thin-film semiconductor chip in which a growth substrate for the semiconductor layer sequence of the semiconductor body 2 is removed after the epitaxial deposition thereof. In a good approximation, such a semiconductor chip represents a Lambertian surface emitter. Deviating therefrom, however, the growth substrate may also remain completely in the semiconductor chip or may be removed or thinned only in regions.

III-V-compound semiconductor materials are used to produce radiation in the ultraviolet ($Al_xIn_yGa_{1-x-y}N$) via the visible ($Al_xIn_yGa_{1-x-y}N$, in particular for blue to green radiation, or $Al_xIn_yGa_{1-x-y}P$, in particular for yellow to red radiation) up to the infrared ($Al_xIn_yGa_{1-x-y}As$) spectral range is particularly suitable. In this case, $0 \leq x \leq 1$, $0 \leq y \leq 1$ and $x+y \leq 1$, in particular where $x \neq 1$, $y \neq 1$, $x \neq 0$ and/or $y \neq 0$. With III-V-compound semiconductor materials, in particular from the material systems, high internal quantum efficiencies may also be achieved during radiation generation.

The semiconductor body 2 has a plurality of recesses 25 that extend from the main surface 27 through the second semiconductor layer 22 and the active region 20 into the first semiconductor layer 21 and end there. For reasons of better presentation, only two recesses 25 are shown in the drawing. The recesses 25 each electrically conductively connect to a first connection layer 31 extending between the semiconductor body 2 and the carrier 5. The recesses 25 electrically conductively connect to one another by the connection layer 31.

Charge carriers can be injected uniformly into the first semiconductor layer 21 in lateral direction via the plurality of recesses 25. Depending on the transverse conductivity of the first semiconductor layer 21, the number of recesses 25 may be varied within wide limits. In the extreme case, a single recess 25 may already be sufficient for electrically contacting the first semi-conductor layer 21.

The semiconductor chip 1 comprises a carrier 5 extending in the vertical direction between a front side 51 and a rear side 52. In this example, the carrier 5 has, for example, a doped semi-conductor material such as silicon or germanium. The first and the second electrical connection layer 31, 32 are arranged between the carrier 5 and the semiconductor body 2. The semiconductor body 2 together with the connection layer 31, 32 connect to the carrier 5 in a mechanically stable manner by a connecting layer (not shown), for example, by an electrically conductive adhesive layer or a solder layer.

In addition, the first connecting layer 31 covers the carrier 5 over the entire surface in the region of the recesses 25 and extends horizontally along the front side 51 of the carrier 5. In the region of a recess 25 the first connection layer is delimited in the lateral direction by an insulation layer 9 of the recess extending in the vertical direction through the recess along the semiconductor layer sequence. The first semiconductor layer 21 electrically conductively connects to a first contact 41 via the first connection layer 31. The first contact 41 is located on the front side of the semiconductor chip laterally from the semiconductor body 2.

The optoelectronic semiconductor chip 1 further comprises a second connection layer 32 electrically conductively connected to the second semiconductor layer 22. The connection layer 32 extends at least partially in the horizontal direction along the main surface 27 of the semi-conductor body 2. The connection layer 32 extends laterally as far that at one end a second contact 42 is formed. The first connection layer 31 and the second connection layer 32 may overlap at least in regions in a plan view of the semiconductor chip 1.

The first and second contact 41, 42 may be formed as an additional layer to the first or second connection layer 31, 32, as is shown in FIG. 1. Alternatively, a region of the first or second connection layer 31, 32 that is freely accessible for external electrical contacting may also form the contacts 41, 42.

An insulation layer 9 is formed between the first connection layer 31 and the second connection layer 32 and, in addition, partially along the carrier 5. The insulation layer 9 also covers side surfaces of the recesses 25 and thus insulates the first connection layer 31 from the second semiconductor layer 22 and from the active region 20. In other words, the first contact 41 and the second contact 42 electrically conductively connect to one another only via a diode. During operation of the optoelectronic semiconductor chip 1, an external electrical voltage may therefore be applied between the first contact 41 and the second contact 42 so that charge carriers are injected into the active region 20 and recombine there with emission of radiation.

An electrically insulating separating layer 6 is provided between the semiconductor body 2 and the carrier 5. The electrically insulating separating layer 6 extends in a horizontal direction parallel to the main surface 27 of the semiconductor body 2 or along the front side 51 of the carrier 5. In this example, the electrically insulating separating layer 6 comprises a layer sequence comprising a first separating layer 61, a second separating layer and a third separating layer.

The first separating layer 61 is a closed layer formed by an atomic layer deposition method (in this case: ALD). Alternatively, the first separating layer 61 may also be formed using a molecular layer deposition method (here: MLD). The first separating layer 61 comprises at least one monolayer made of an electrically insulating material, for example, $Al_2O_3$, $SiO_2$ or $Ta_2O_5$ or a combination of these materials. The first separating layer 61 has, for example, a thickness of approximately 40 nm, thus comprises a plurality of monolayers. Depending on the desired degree of insulation and the field of application, the first separating layer 61 may have other thicknesses that can be up to several 100 nm. The thickness of the first separating layer 61 is limited to a smaller thickness, for example, due to cost considerations because the atomic layer deposition method can apply monolayers only successively and is thus time-consuming.

The first separating layer 61 is a dielectric formed in the manner of an interlayer comprising the second and third separating layer 62, 63. Both the second and the third separating layer 62, 63 represent layers applied by a gas phase deposition method or sputtering method. Materials that can be used here are likewise electrically insulating materials, for example, $SiO_2$, $SiN_x$ or Si—ON.

As a result of the deposition from the gas phase at low temperatures, the second and third separating layer 62, 63 have pinholes and pores, which may become noticeable in a significant reduction of the breakdown voltage. In addition, cracks form in the topography in the two separating layers at the steps. The first separating layer 61 is a layer that is closed in a high degree and has very good overshaping properties, which already provides a high reliable electrical insulation as an individual layer. Direct application of the first separating layer 61 to the CVD-based layer counteracts the effects of the pinholes and cracks on the breakdown strength, and the same are closed or filled. In this way, electrical breakdowns can be eliminated or reduced at low applied voltages, for example, of 100 V to 200 V. Application of the first separating layer to a CVD-based or sputtered layer or the introduction of the first separating layer 61 as an interlayer thus allows an even more reliable insulation of the front and rear sides of the optoelectronic semiconductor chip than would be possible with a conventional CVD-based layer or layer sequence.

In further examples (not shown), thin-film semiconductor chips are possible, which have no recesses 25 and such thin-film semiconductor chips, in which the connection 32 for the first semiconductor layer sequence is arranged on the semiconductor body 2. Furthermore, carrier-free thin-film semiconductor chips are possible as a variant. For example, the carrier thereof has a molding material.

Figure 2:
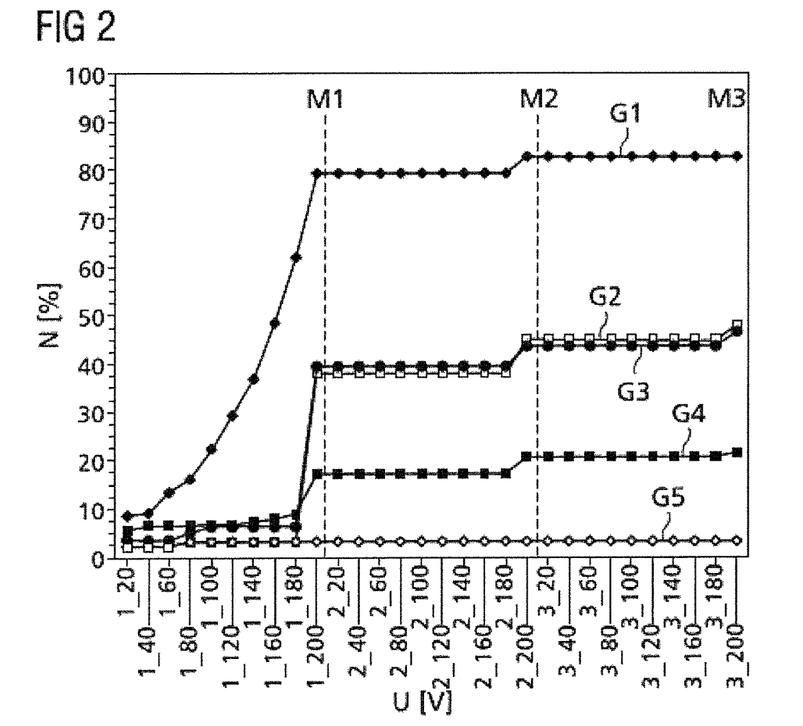
FIG. 2 shows measurement characteristics of optoelectronic semiconductor chips with different separating layers.

FIG. 2 shows the measurement characteristics of optoelectronic semiconductor chips with different insulation layers 9.

Measuring curves are illustrated with which the improved electrical insulation is illustrated by the method presented. Different curves are shown that oppose the results of different isolation precautionary measures. In this case, in each case different voltages have been applied between the front side of the chip and the rear side of the chip, and the number of chips with breakthroughs is determined. The curves G1 to G4 originate from semiconductor chips having insulation layers that have been applied completely by gas deposition. Each of the layers have the same total thickness, they differ only in the arrangement and/or the thicknesses of the individual layers of $SiO_2$ and $SiN_x$. Finally, the curve g5 shows the measurement data of a layer sequence comprising the first, second and third separating layer 61, 62, 63 as discussed in connection with FIG. 1.

The X-axis shows a voltage U [V] applied to the respective semiconductor chip plotted for a first, second and third measurement cycle. The voltage was increased from zero to a value Umax. For each value U, the semiconductor chips were then sorted out, which showed failure of the insulation as a result of the voltage. The number of the sorted semiconductor chips is specified in percent on the Y-axis.

The graph shows a surprising effect that is achievable with the layer sequence of the proposed principle. The curve G1 shows that a layer sequence only from layers of a gas-phase deposition already lead to a considerable loss N[%] of close to 80% in the first measuring cycle. By suitable variation of the CVD-based single layers at the same total thickness, the failure rate may be significantly reduced, however, the failure rate is high and may lead to additional costs and efforts in the production and test phase of semiconductor chips. Moreover, the failure rate N[%] increases with the applied voltage U, as expected. On the other hand, the proposed layer sequence exhibits a significantly different course. According to measurement curve G5 the failure rate is not only significantly reduced, but it is also independent of the applied voltage within the test area. The negligible failures with minimal value of U in the first measurement cycle are attributed to other problems of the respective semiconductor chip such as processing errors.

This application claims priority of DE 10 2015 116 495.7, the subject matter of which is hereby incorporated by reference.

Our chips and methods are not restricted to the examples by the description on the basis of the examples. Rather, this disclosure encompasses any novel feature and also any combination of features, which in particular includes any combination of features in the appended claims, even if the feature or combination itself is not explicitly specified in the claims or examples.

The invention claimed is:

1. An optoelectronic semiconductor chip comprising a carrier and a semiconductor body having a semiconductor layer sequence arranged on the carrier, and a front side of the chip and a rear side of the chip, wherein
   the semiconductor layer sequence comprises an active region arranged between a first semiconductor layer and a second semiconductor layer and generates or receives electromagnetic radiation,
   the first semiconductor layer electrically conductively connects to a first contact,
   the first contact is formed on the front side of the chip next to the active region,
   the second semiconductor layer electrically conductively connects to a second contact,
   the second contact is arranged on the front side of the chip next to the active region, and
   an electrically insulating separating layer that electrically insulates the rear side of the chip from the active region of the semiconductor chip, and the electrically insulating separating layer is formed of a first separating layer, a second separating layer and a third separating layer,
   wherein the first separating layer, the second separating layer and the third separating layer are distinct layers, and
   the first separating layer is formed by atomic layer deposition or molecular layer deposition.

2. The semiconductor chip according to claim 1, wherein the electrically insulating separating layer is arranged on a front side of the carrier, on a rear side of the carrier or within the carrier.

3. The semiconductor chip according to claim 1, wherein the first separating layer has an atomic layer and/or molecular layer having one or more layers.

4. The semiconductor chip according to claim 1, wherein the first separating layer has at least one or more insulating oxide or nitride compounds or one or more material selected from the group consisting of $Al_xO_y$, $SiO_2$, $Ta_xO_y$, TaN, TiO, SiN, AlN, TiN, $ZrO_2$, $HfO_2$, $HfSiO_4$, $ZrSiO_4$ and HfSiON.

5. The semiconductor chip according claim 1, wherein the electrically insulating separating layer is made of electrically insulating materials.

6. The semiconductor chip according to claim 1, wherein the second separating layer has one or more layers deposited by gas phase deposition or sputtering methods.

7. The semiconductor chip according to claim 6, wherein the third separating layer has one or more layers deposited by a gas phase deposition or a sputtering method, and the first separating layer is at least partially enclosed by the second and third separating layer.

8. The semiconductor chip according to claim 1, wherein the second and/or the third separating layer has at least one or more insulating oxide or nitride compounds or one or more material selected from the group consisting of $SiN_x$, Si—ON, $SiO_2$, $Al_xO_y$, $Ta_xO_y$, TaN, TiO, SiN, AlN, TiN, $ZrO_2$, $HfO_2$, $HfSiO_4$, $ZrSiO_4$ and HfSiON.

9. The semiconductor chip according to claim 1, wherein the carrier comprises an electrically conductive material, semiconducting material, a molding material, a ceramic material and/or a high-resistance material.

10. The semiconductor chip according to claim 1, wherein the first semiconductor layer is arranged on the side of the carrier facing away from the active region and the first semiconductor layer connects to the first contact via a first connection layer.

11. The semiconductor chip according to claim 1, wherein the semiconductor body has at least one recess extending through the second semiconductor layer and through the active region, and the first connection layer is arranged at least partially in the recess and connects to the first semiconductor layer.

12. The semiconductor chip according to claim 1,
   wherein the second semiconductor layer electrically conductively connects to the second contact via the second connection layer, and
   the second connection layer is arranged on the side of the active region facing the carrier.

13. The semiconductor chip according to claim 1, wherein
   the electrically insulating separating layer is formed over the entire surface of a main surface of the carrier,
   the second separating layer and the third separating layer are formed by gas phase deposition,
   the first separating layer is arranged between the second separating layer and the third separating layer, and
   the first separating layer is in direct contact with the second separating layer and the third separating layer.

14. A method of producing an optoelectronic semiconductor chip having a front side of the chip and an underside of the chip, comprising:
   providing a semiconductor layer sequence having an active region arranged between a first semiconductor layer and a second semiconductor layer;
   forming a first contact on the front side of the chip next to the active region, and forming an electrically conductive connection between the first semiconductor layer and the first contact,
   forming a second contact on the front side of the chip next to the active region, and forming an electrically conductive connection between the second semiconductor layer and the second contact,
   forming an electrically insulating separating layer by atomic layer coating or molecular layer coating that electrically insulates the rear side of the chip from the active region of the semiconductor chip, and
   forming a composite of semiconductor layer sequence and carrier.

15. The method according to claim 14, wherein
the electrically insulating separating layer is applied by combination of a first separating layer and at least one second separating layer,
the first separating layer is formed on the basis of atomic layer deposition or molecular layer deposition,
the second separating layer is formed on the basis of a gas phase deposition or on the basis of a sputtering method, and
the depositions of the first and second separating layer take place in immediate succession.

16. The method according to claim 14, wherein the electrically insulating separating layer is applied by at least one of the following atomic layer coating and/or molecular layer coating methods:
atomic layer deposition,
atomic layer epitaxy,
atomic layer evaporation,
atomic layer growth,
molecular layer deposition, and
molecular layer epitaxy.

17. The method according to claim 14, wherein
the electrically insulating separating layer is formed over the entire surface on a main surface of the carrier,
the electrically insulating separating layer is formed of a first separating layer, a second separating layer and a third separating layer,
wherein the first separating layer is arranged between the second separating layer and the third separating layer and the first separating layer is in contact with the second separating layer and the third separating layer,
the first separating layer is formed by atomic layer deposition or molecular layer deposition, and
the second separating layer and the third separating layer are formed by gas phase deposition.

* * * * *